(12) United States Patent
Ingino, Jr.

(10) Patent No.: US 7,132,880 B2
(45) Date of Patent: Nov. 7, 2006

(54) HIGH BANDWIDTH, HIGH PSRR, LOW DROPOUT VOLTAGE REGULATOR

(75) Inventor: Joseph M. Ingino, Jr., New York, NY (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 11/146,448

(22) Filed: Jun. 7, 2005

(65) Prior Publication Data

US 2005/0225380 A1 Oct. 13, 2005

Related U.S. Application Data

(60) Continuation of application No. 10/616,447, filed on Jul. 9, 2003, now Pat. No. 6,914,476, which is a division of application No. 09/833,299, filed on Apr. 11, 2001, now Pat. No. 6,621,675.

(60) Provisional application No. 60/266,077, filed on Feb. 2, 2001.

(51) Int. Cl.
*G05F 1/10* (2006.01)
*G05F 3/02* (2006.01)

(52) U.S. Cl. .................................................. 327/541

(58) Field of Classification Search ................ 327/538, 327/540–541, 543; 323/280, 281, 316
See application file for complete search history.

(56) References Cited

U.S. PATENT DOCUMENTS

| | | | |
|---|---|---|---|
| 3,908,159 A | 9/1975 | Griffey | 363/54 |
| 4,319,207 A | 3/1982 | Gignoux | 333/173 |
| 5,130,883 A | 7/1992 | Edwards | 361/91 |
| 5,151,665 A | 9/1992 | Wentzler | 331/8 |
| 5,191,278 A | 3/1993 | Carpenter | 323/275 |
| 5,345,119 A | 9/1994 | Khoury | 307/521 |
| 5,404,250 A | 4/1995 | Hase et al. | 360/57 |
| 5,485,126 A | 1/1996 | Gersbach et al. | 331/57 |
| 5,512,861 A | 4/1996 | Sharma | 331/74 |
| 5,559,474 A | 9/1996 | Matsumoto et al. | 331/17 |
| 5,631,587 A | 5/1997 | Co et al. | 327/107 |
| 5,898,336 A | 4/1999 | Yamagushi | 327/157 |
| 5,977,806 A | 11/1999 | Kikuchi | 327/157 |
| 5,999,039 A | 12/1999 | Holst et al. | 327/532 |

(Continued)

FOREIGN PATENT DOCUMENTS

EP 282 673 9/1988

(Continued)

OTHER PUBLICATIONS

Young, et al., "A PLL Clock Generator with 5 to 110 MHz of Lock Range for Microprocessors," IEEE Journal of Slid-State Circuits, vol. 27, No. 11, Nov. 1992, 9 pages.

(Continued)

*Primary Examiner*—Quan Tra
(74) *Attorney, Agent, or Firm*—Garlick Harrison & Markison

(57) ABSTRACT

A voltage regulator may include one or more features for generating high PSRR. For example, source follower devices may be included in the voltage regulator for providing current sources for the output voltage nodes. The source followers may be sensitive to power supply noise at the gate terminal. Filters are included on the gate terminals to filter the power supply noise, thus reducing the noise at the gate terminals. As another example, the voltage regulator may employ current sources on the output voltage nodes which produce current inversely proportional to the current drawn by the load. In one embodiment, the voltage regulator may include a power control circuit used to provide overvoltage protection during power up. The power control circuit provides a voltage during power up, and ceases providing the voltage after a time interval so that the circuit may operate.

3 Claims, 9 Drawing Sheets

U.S. PATENT DOCUMENTS

| | | | | |
|---|---|---|---|---|
| 5,999,353 | A | 12/1999 | Hase et al. | 360/51 |
| 6,018,265 | A | 1/2000 | Keshtbod | 327/540 |
| 6,037,622 | A | 3/2000 | Lin et al. | 257/299 |
| 6,046,624 | A * | 4/2000 | Nam et al. | 327/530 |
| 6,046,626 | A | 4/2000 | Saeki et al. | 327/536 |
| 6,097,227 | A | 8/2000 | Hayashi | 327/158 |
| 6,127,880 | A | 10/2000 | Holst et al. | 327/531 |
| 6,150,800 | A | 11/2000 | Kinoshita et al. | 323/280 |
| 6,184,746 | B1 | 2/2001 | Crowley | 327/551 |
| 6,278,320 | B1 | 8/2001 | Vu | 327/539 |
| 6,297,688 | B1 * | 10/2001 | Nakamura | 327/538 |
| 6,313,615 | B1 | 11/2001 | Fayneh et al. | 323/281 |
| 6,320,470 | B1 | 11/2001 | Arai et al. | 331/17 |
| 6,333,623 | B1 * | 12/2001 | Heisley et al. | 323/280 |
| 6,356,158 | B1 | 3/2002 | Lesea | 331/11 |
| 6,441,660 | B1 | 8/2002 | Ingino, Jr. | 327/157 |
| 6,483,358 | B1 | 11/2002 | Ingino, Jr. | 327/157 |
| 6,556,058 | B1 | 4/2003 | Ohbayashi et al. | 327/143 |
| 6,566,970 | B1 | 5/2003 | Ingino, Jr. | 331/57 |
| 6,597,217 | B1 | 7/2003 | Ingino, Jr. | 327/157 |

FOREIGN PATENT DOCUMENTS

| | | |
|---|---|---|
| EP | 0 661 616 | 7/1995 |
| EP | 02250520.0 | 6/2004 |

OTHER PUBLICATIONS

Vincent R. von Kaenel, "A High-Speed, Low-Power Clock Generator for a Microprocessor Application," IEEE Journal of Solid-State Circuits, vol. 33, No. 11, Nov. 1998, 3 pages.

Patrik Larsson, BellLabs, Lucent Technologies, Holmdel, NJ, "A2-1600Nhz 1.2-2.5V CMOS Clock-Recovery PLL with Feedback Phase-Selection and Averaging Phase-Interpolation for Jitter Reduction," IEEE International Solid-State Circuits Conference, ISSCC99/Session 20/Paper WA 20.6, 1999, 1 page.

Bult, et al., "A Fast-Settling CMOS Op Amp for SC Circuits with 90-dB DC Gain," IEEE Journal of Solid-State Circuits, vol. 25, No. 6, Dec. 1990, 3 pages.

von Kaenel, et al., "A 320 MHz, 1.5 mW @ 1.35 V CMOS PLL for Microprocessor Clock Generation," IEEE Journal of Solid-State Circuits, vol. 31, NO. 11, Nov. 1996, 4 pages.

Horowitz, "The Art of Electronics," Cambridge Univ. Press, 198015 pages.

SiByte, "Target Applications," http://sibyte.com/mercurian/applications.htm, Jan. 15, 2001, 2 pages.

SiByte, "SiByte Technology," http://sibyte.com/mercurian/technology.htm, Jan. 15, 2001, 3 pages.

SiByte, "The Mecurian Processor," http://sibyte.com/mercurain, Jan. 15, 2001, 2 pages.

SiByte, "Fact Sheet," SB-1 CPU, Oct. 2000, rev. 0.1, 1 page.

SiByte, "Fact Sheet," SB-1250, Oct. 2000, rev. 0.2, 10 pages.

Stepanian, SiByte, SiByte SB-1 MIPS64 CPU Core, Embedded Processor Forum 2000, Jun. 13, 2000, 15 pages.

Jim Keller, "The Mercurian Processor: A High Performance, Power-Efficient CMP for Networking," Oct. 10, 2000, 22 pages.

Tom R. Halfhill, "SiByte Reveals 64-Bit Core For NPUs; Independent MIPS64 Design Combines Low Power, High Performance," Microdesign Resources, Jun. 2000, Microprocessor Report, 4 pages.

* cited by examiner

HIGH BANDWIDTH, HIGH PSRR, LOW DROPOUT VOLTAGE REGULATOR

PRIORITY INFORMATION

This application is a continuation of and claims priority to U.S. Patent Application having an application Ser. No. 10/616,447; filed Jul. 9, 2003 now U.S. Pat. No. 6,914,476, which application is a divisional of and claims priority to U.S. patent application Ser. No. 09/833,299; filed Apr. 11, 2001, now U.S. Pat. No. 6,621,675, which application claims benefit of priority to U.S. Provisional Application No. 60/266,077; filed Feb. 2, 2001, and in which all are herein incorporated by reference.

BACKGROUND OF THE INVENTION

1. Field of the Invention

This invention is related to the field of voltage regulators, and particularly to a voltage regulator employed within a phase locked loop (PLL).

2. Description of the Related Art

Voltage regulators are used in a variety of systems to provide a regulated voltage to other circuits in the system. Generally, it is desirable to provide a stable regulated voltage in the face of a wide variety of loads, operating frequencies, etc.

A measure of the effectiveness of a voltage regulator is its power supply rejection ratio (PSRR), which measures the amount of noise present on the power supply to the voltage regulator which is transmitted to the regulated voltage. A high PSRR is indicative of a low amount of transmission of noise, and a low PSRR is indicative of a high amount of noise transmission. A high PSRR, particularly across a wide range of operating frequencies of the devices being supplied by the voltage regulator, is difficult to achieve.

For example, voltage regulators have been used in the past to power PLL circuitry. However, PSRRs of voltage regulators used in PLLs have been limited. For example, PSRRs greater than 25 dB may not been achieved in voltage regulators used in PLLs.

SUMMARY OF THE INVENTION

A voltage regulator is provided which may include one or more features for generating high PSRR. For example, source follower devices may be included in the voltage regulator for providing current sources for the output voltage nodes. The source followers may be sensitive to power supply noise at the gate terminal. Filters are included on the gate terminals to filter the power supply noise, thus reducing the noise at the gate terminals. As another example, the voltage regulator may employ current sources on the output voltage nodes which produce current inversely proportional to the current drawn by the load. Current variation on the output node may be reduced, which may ease the regulation of the voltage.

In one embodiment, the voltage regulator may include a power control circuit used to provide overvoltage protection during power up. For example, the above mentioned source followers may experience an overvoltage condition during power up since the gate terminals are charged through an RC time constant while the drain terminal may rapidly be powered to the power supply voltage. The power control circuit provides a voltage on the gate terminal during power up, and ceases providing the voltage after a time interval so that the circuit may operate.

While the above circuits are illustrated within a voltage regulator, they may also be used in other contexts, as desired.

Broadly speaking, a circuit is contemplated. The circuit includes a first N-type transistor having a first terminal coupled to a power supply, a second terminal and a first gate terminal. The circuit further includes a filter coupled between the power supply and the first gate terminal.

Additionally, a circuit is contemplated comprising a first transistor having a first terminal coupled to a power supply, a second terminal, and a first gate terminal; and a power control circuit. The power control circuit is configured, during a time period commencing at power up of the circuit, to supply a voltage to one of the second terminal and the first gate terminal to prevent an overvoltage condition on the first transistor. Additionally, the power control circuit is configured, at a termination of the time period, to cease supplying the voltage.

Moreover, a circuit is contemplated. The circuit includes an operational amplifier (op amp); a first transistor having a gate terminal coupled to an output of the op amp and having a first terminal and a second terminal; and a first current source. The first terminal is an output to which a load is couplable, the load being capable of drawing a variable current from the first terminal during operation. The first current source coupled to the first terminal and draws a first current from the first terminal which is inversely proportional to the current drawn by the load during operation.

BRIEF DESCRIPTION OF THE DRAWINGS

The following detailed description makes reference to the accompanying drawings, which are now briefly described.

Figure 1:
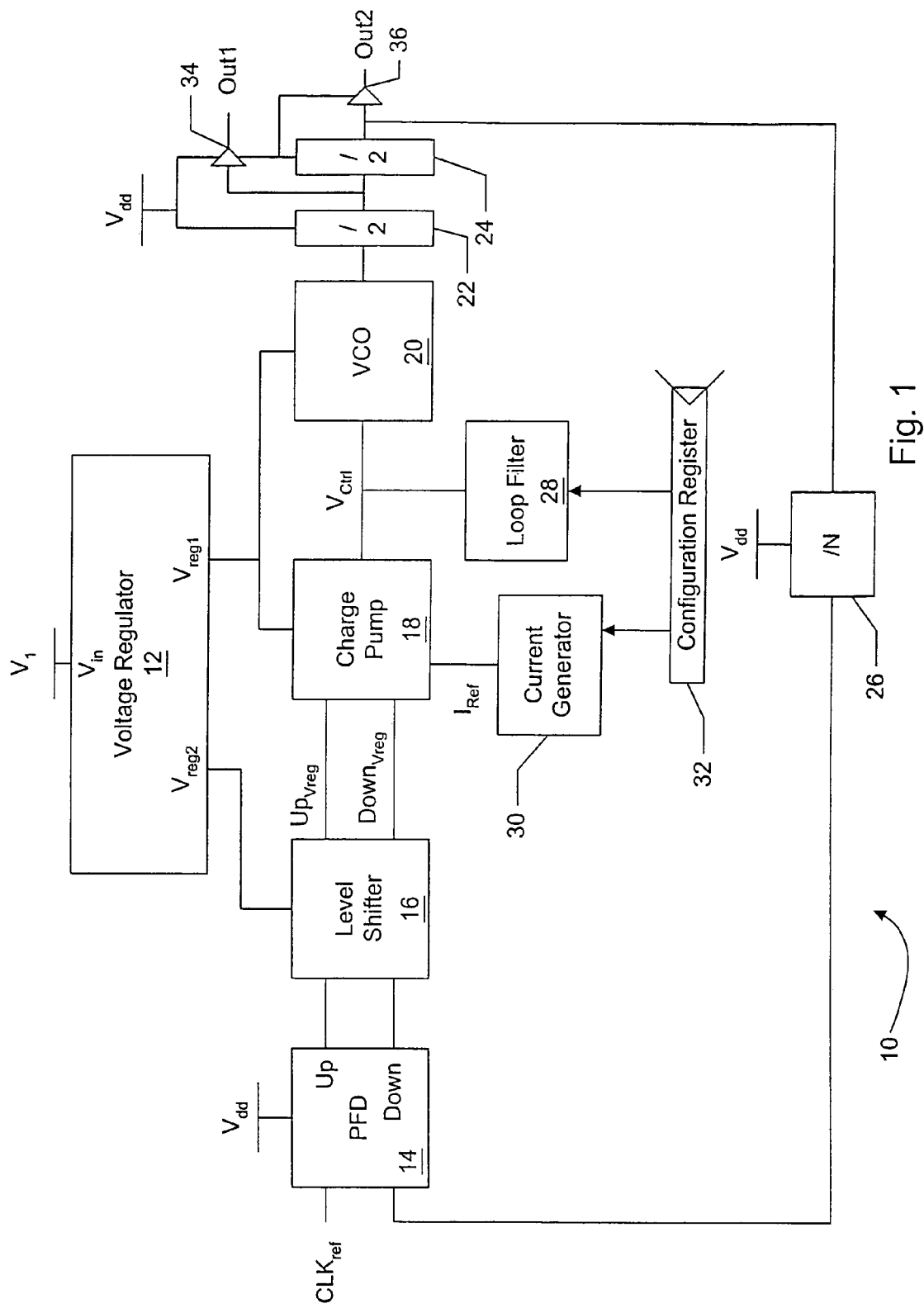
FIG. 1 is a block diagram of one embodiment of a phase locked loop (PLL).

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to FIG. 1, a block diagram of one embodiment of a phase locked loop (PLL) 10 is shown. Other embodiments are possible and contemplated. In the embodiment of FIG. 1, the PLL 10 includes a voltage regulator 12, a phase/frequency detector (PFD) 14, a level shifter 16, a charge pump 18, a voltage controlled oscillator (VCO) 20, a pair of divide by two circuits 22 and 24, a divide by N circuit 26, a loop filter 28, a current generator 30, a configuration register 32, and a pair of output buffers 34 and 36. In the embodiment of FIG. 1, the voltage regulator 12 is coupled to a first power supply which supplies a first voltage ($V_1$). The voltage regulator 12 provides regulated output voltages $V_{reg1}$ and $V_{reg2}$. The level shifter 16 is powered by $V_{reg2}$, while the charge pump 18 and the VCO 20 are powered by $V_{reg1}$. The output buffers 34 and 26, the divide by 2 circuits 22 and 24, the divide by N circuit 26, and the PFD 14 are powered by a $V_{dd}$ supply voltage. The PFD 14 is coupled to receive the output of the divide by N circuit 26 and to receive a reference clock $CLK_{ref}$. The PFD 14 provides Up and Down signals to the level shifter 16, which level shifts the Up and Down signals from the $V_{dd}$ voltage domain to the $V_{reg}$ voltage domain corresponding to $V_{reg1}$ and $V_{reg2}$. The charge pump 18 is coupled to receive the level-shifted Up and Down signals from the level shifter 16 as well as a reference current $I_{ref}$ from the current generator 30. The charge pump 18 provides an output voltage $V_{Ctrl}$ to the VCO 20, and the loop filter 28 is coupled to the node between the charge pump 18 and the VCO 20 as well. Both the loop filter 28 and the charge pump 18 are programmable via values in the configuration register 32 to which the loop filter 28 and the current generator 30 are coupled. Particularly, the charge pump 18 is programmable by changing the reference current $I_{ref}$, as described in more detail below. The VCO 20 provides an output signal to the series connection of the divide by two circuits 22 and 24 (the output of each being buffered by output buffers 34 and 36, respectively). The output of the divide by 2 circuit 24 is fed back to the divide by N circuit 26.

Generally, the $V_{dd}$ voltage may be the voltage supplied to the circuitry within an integrated circuit also employing the PLL 10. Accordingly, the $V_{dd}$ voltage may be subject to a large amount of noise (variations in the voltage due to, e.g., digital switching in the integrated circuit, etc.). The $V_1$ voltage may also be subject to noise. In one implementation, the $V_1$ voltage may be the voltage supplied to input/output circuits of the integrated circuit. The $V_{dd}$ and $V_1$ voltages may be any suitable voltages, and may supply any other suitable circuitry, as desired. In one exemplary implementation, the $V_{dd}$ voltage may be nominally 1.2 volts and the $V_1$ voltage may be nominally 3.3 volts. However, the voltages may be varied in other implementations. The $V_{dd}$ voltage may depend, at least in part, on the process technology used to form the transistors within PLL 10. The $V_1$ voltage may depend on the process technology as well as external interface demands.

Figure 6:
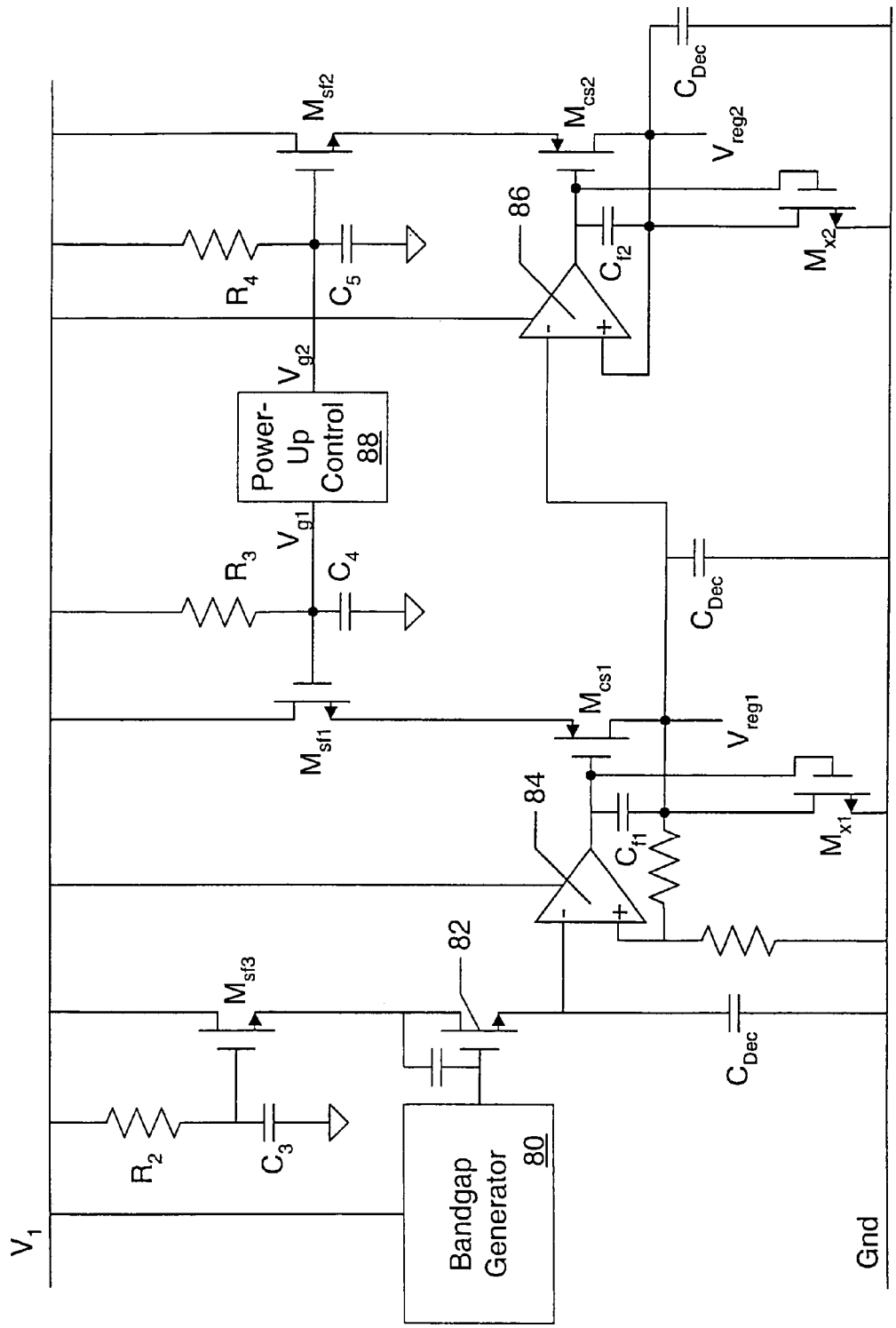
FIG. 6 is a circuit diagram of one embodiment of a voltage regulator shown in FIG. 1.

Since the $V_{dd}$ and $V_1$ voltages are noisy, they may be unsuitable for powering certain blocks of the PLL 10. Specifically, the charge pump 18 and the VCO 20 may be sensitive to power supply noise, and may function less accurately in the presence of power supply noise. Accordingly, these blocks are supplied with a regulated voltage from the voltage regulator 12 (specifically, $V_{reg1}$). In one embodiment described below, the voltage regulator 12 provides regulated voltages with a power supply rejection ratio (PSRR) greater than 40 decibels (dB), while prior voltage regulators in such contexts may have been limited to a PSRR of about 25 dB. The PSRR achieved by various embodiments of the voltage regulator 12 may vary depending upon which features of the voltage regulator as illustrated in FIG. 6 below are implemented, tradeoffs in the voltage regulator design even if the features are implemented, etc. The voltage regulator 12 may provide two regulated voltages ($V_{reg2}$ and $V_{reg1}$, which may be equal in the illustrated embodiment). The second regulated voltage ($V_{reg2}$) supplies the level shifter 16.

The level shifter 16 may serve as a noise reduction device in addition to shifting the Up and Down signals from $V_{dd}$ voltage swings to $V_{reg}$ voltage swings. The Up and Down signals provided by the PFD 14 may be noisy, as they are generated in the noisy $V_{dd}$ voltage domain. The level shifter 16 passes these signals through various active devices (e.g. transistors) and thus the noise level is attenuated in the active devices. Accordingly, the Up and Down signals presented to the charge pump 18 may be less noisy and thus may enhance the accuracy of the charge pump 18 and the VCO 20.

Figure 2:
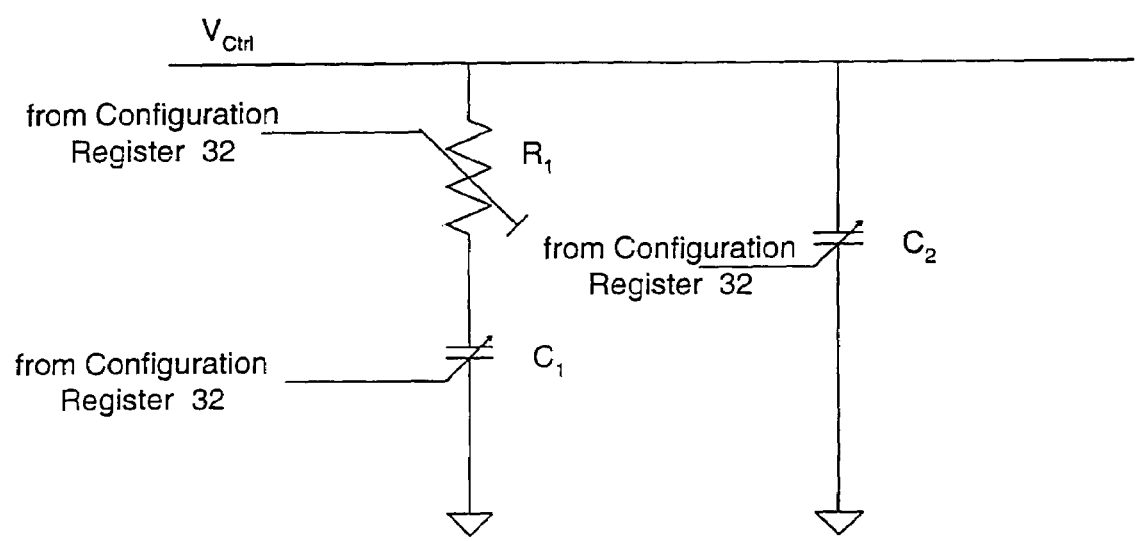
FIG. 2 is a circuit diagram of one embodiment of a loop filter shown in FIG. 1.

Both the loop filter 28 and the charge pump 18 may be programmable through configuration register 32. The charge pump 18 is programmed by changing the reference current $I_{ref}$ supplied to the charge pump 18 (e.g. by the current generator 30 in the illustrated embodiment). In one embodiment, the current generator 30 may be supplied by the $V_{reg1}$ voltage as well (or the $V_{reg2}$ voltage, if desired). The loop filter 28 may be programmed by changing the resistor and capacitor values therein. An exemplary loop filter is illustrated in FIG. 2 below.

By adjusting the loop filter 28 and the charge pump 18, the damping, loop bandwidth and lock time of the PLL 10 may be adjusted for a given operating range. Thus, the PLL 10 may be optimized for a selected operating range in a given device, and thus the flexibility of the PLL 10 over a large operating range may be enhanced. As an example, increasing the reference current $I_{ref}$ may increase the rate at which the charge pump 18 may vary the $V_{Ctrl}$ voltage, and thus may decrease the lock time of the PLL 10 while decreasing the damping of the loop. Varying the loop filter parameters may change which low and high frequencies of the $V_{Ctrl}$ voltage are filtered out. These modifications may affect the lock time, damping, loop bandwidth, and jitter as well.

It is noted that, while the configuration register 32 is illustrated in proximity to the other elements of the PLL 10, the configuration register 32 may be located elsewhere. For example, in one embodiment, the PLL 10 may be included in a system on a chip design which integrates the PLL 10 with one or more processors, memory, bus bridges, etc. The configuration register 32 may be located in one of the processors, and the values stored therein may be transmitted to the PLL 10. Furthermore, other methods for programming the charge pump 18 and the loop filter 28 may be used. For example, pins on the integrated circuit including the PLL 10 may be set to appropriate voltages to provide the selected values. A combination of pins and configuration register values may also be used.

The PLL 10 may be a low power design. For example, by operating the VCO 20 with a $V_{reg1}$ supply voltage instead of the higher $V_1$ voltage, the voltage swings of the oscillator within the VCO 20 may be limited to a maximum of approximately $V_{reg1}$, thus reducing the power consumed in the VCO 20 as compared to a VCO supplied by the $V_1$ voltage. Additionally, in one implementation, current mirrors within the charge pump 18 and the VCO 20 may be implemented without cascoding (which may increases the device count and thus may lead to increased the power dissipation). Additionally, for VCO 20, cascoding the current mirrors reduces the maximum voltage that may be applied to the ring oscillator and thus would reduce the maximum output frequency of the VCO 20. Cascoded current mirrors are typically used to improve the operation of the current mirrors as current sources by attenuating supply noise. The non-cascoded current mirrors may provide acceptable current source operation since the voltage regulator 12 and the level shifter 16 operate to minimize the noise experienced by the charge pump 18 and the VCO 20. Still further, non-cascoded structures may more readily allow for transistors to remain in saturation, which may improve the performance of the transistors. Additionally, self-biasing may be used to ensure that voltages referenced to the $V_{dd}$ and/or $V_1$ voltages track changes in those voltages properly.

The voltage regulator 12 provides the PLL 10 with supply decoupling from the $V_1$ power supply. Additionally, in one implementation, the PLL 10 may employ relatively large decoupling capacitance on critical nodes. For example, large decoupling capacitances may be provided on the $V_{reg2}$ and $V_{reg1}$ nodes. These capacitances may cause a corresponding variation on the $V_{reg2}$ and $V_{reg1}$ nodes in response to ground variations ("ground bounce"), thus preserving the $V_{reg2}/V_{reg1}$ to ground potential. Furthermore, these decoupling capacitances may substantially reduce the effect of supply variations ("supply bounce") on the corresponding nodes.

The PFD 14 generally compares the frequency and phase of the clock output by the divide by N circuit 26 to the reference clock $CLK_{ref}$. If the phase of the clock output of the divide by N circuit 26 lags the phase of the reference clock, the PFD 14 activates the Up signal during the lagging period. If the phase of the clock output of the divide by N circuit 26 leads the phase of the reference clock, the PFD 14 activates the Down signal during the lagging period. Any suitable design may be used for the PFD 14, although in one embodiment a dual D flip flop design is used.

As mentioned above, the level shifter level shifts the Up and Down outputs of the PFD 14 from the $V_{dd}$ voltage to the $V_{reg}$ voltage. These level-shifted Up and Down signals ($Up_{Vreg}$ and $Down_{Vreg}$, respectively) are applied to the charge pump 18. In response to an active Up signal, the charge pump 18 increases the charge on the output node, thus increasing $V_{Ctrl}$. In response to an active Down signal, the charge pump 18 decreases the charge on the output node, thus decreasing $V_{Ctrl}$. Increasing $V_{Ctrl}$ causes the VCO 20 to increase its output frequency, while decreasing $V_{Ctrl}$ causes the VCO 20 to decrease its output frequency.

It is noted that the Up and Down signals may be activated, or considered to be active, at either a high voltage or a low voltage. In the embodiment of the charge pump 18 illustrated in FIG. 3 below, the Up and Down signals are activated at a high ($V_{reg1}$) voltage (and deactivated at a low, or Gnd, voltage). Additionally, in some embodiments such as the one illustrated in FIG. 3 below, the charge pump 18 may use both the true and complement of the Up and Down signals. The complement may be generated by the charge pump 18, the level shifter 16, or the PFD 14, as desired. In this context, a first signal is a "complement" of a second signal if the first signal carries a voltage representing an opposite binary state to the voltage carried by the second signal.

The VCO 20 includes an output circuit which provides a full $V_{dd}$ swing on the clock output from the VCO 20. This output clock is then divided by 2 (in frequency) by the divide by 2 circuit 22 (thus producing PLL output clock Out1). The second divide by 2 circuit 24 divides the frequency by two again (thus producing PLL output clock Out2, which is also fed back to the divide by N circuit 26). Accordingly, Out1 is 2N times the frequency of $CLK_{ref}$ and Out1 is N times the frequency of $CLK_{ref}$ (once the PLL 10 has locked to $CLK_{ref}$).

Other embodiments may produce only one output clock, or more output clocks, and each output clock may be any multiple of the frequency of the clock reference $CLK_{ref}$ using appropriate divide circuits in place of circuits 22, 24, and 26. As used herein, the term "signal swing" refers to a range of voltages which a signal may take on.

It is noted that, while specific embodiments of the loop filter 28, the charge pump 18, the VCO 20, and the voltage regulator 12 are illustrated in FIGS. 2, 3, 5, and 6 below (respectively), other embodiments may use any circuit for each of these elements of PLL 10, in other embodiments. Furthermore, any combination of the embodiments shown in FIGS. 2, 3, 5 and 6 along with conventional embodiments of other elements may be used.

As used herein, the term "power supply" refers to a node which is supplied, during use, with a relatively stable voltage. Thus, in many contexts, the ground node is a power supply node according to this definition, as well as nodes labeled, e.g., $V_1$, $V_{reg1}$, $V_{reg2}$, $V_{dd}$, etc. Thus, coupling to a power supply refers to coupling to the node supplied with the corresponding voltage, during use. Furthermore, references to coupling to a voltage (including ground, or Gnd) or to a voltage supply herein should be interpreted as coupling to the corresponding power supply.

As used herein, a "current mirror" is a circuit having an input for receiving a current and at least one output. The current mirror provides a current on the output which is proportional to the input current. The output current may approximately equal the input current if the transistors forming the current mirror are matched.

Turning next to FIG. 2, a block diagram of one embodiment of the loop filter 28 is shown. Other embodiments are possible and contemplated. In the embodiment of FIG. 2, the loop filter 28 includes a programmable resistor $R_1$ in series with a programmable capacitor $C_1$, the series connection coupled between the output node of the charge pump 18 (the $V_{Ctrl}$ voltage node) and ground, and a programmable capacitor $C_2$ in parallel with the series connection of $R_1$ and $C_1$. In the illustrated embodiment, the loop filter 28 is programmable in response to configuration register values from the configuration register 32.

In the embodiment of FIG. 2, each of the filter components are programmable, providing a high degree of flexibility. Other embodiments may employ fewer programmable components (e.g. only $R_1$ and $C_2$ may be programmable), as desired.

The programmable components may be realized in any suitable fashion. For example, $R_1$ may comprise two or more resistor elements in any series and/or parallel connection. Each resistor element may be shorted (series connection) or disconnected (parallel connection) via a switch which may be controlled by the configuration register value from the configuration register 32. Similarly, each capacitor may comprise one or more capacitor elements in any series and/or parallel connection, and each capacitor element may be shorted (series connection) or disconnected (parallel connection) via a switch which may be controlled by the configuration register value from the configuration register 32.

In one implementation, the register $R_1$ may be programmable in the range of 0 to 33.2 kilo-ohms (kohms), in steps of 8.3 kohms (under worst case process conditions, or 25.0 kohms in steps of 6.25 kohms nominally); the capacitor $C_1$ may be implemented as a parallel combination of 4 capacitors (each included or excluded programmably) having capacitances of approximately 20 picoFarads, 20 picoFarads, 10 picoFarads, and 5 picoFarads, respectively; and the capacitor $C_2$ may be implemented as a parallel combination of a capacitor of approximately 1.25 picoFarads and a capacitor programmably included or excluded and of approximately 0.5 picoFarads. In one specific implementation, the resistor may be implemented of P+ polysilicon material using a unit cell approach, where each unit cell is approximately 1.184 kohms. The array of unit cells may be surrounded by dummy cells. The dimensions of the polysilicon may be material and/or process dependent, as is known to those of skill in the art. Alternatively, transistors may be used to construct the resistors. The capacitors may, in one implementation, be constructed from transistors with the gate terminal coupled as one capacitor input and the source and drain terminals and the bulk terminal shorted to the other capacitor terminal (e.g. ground).

Figure 3:
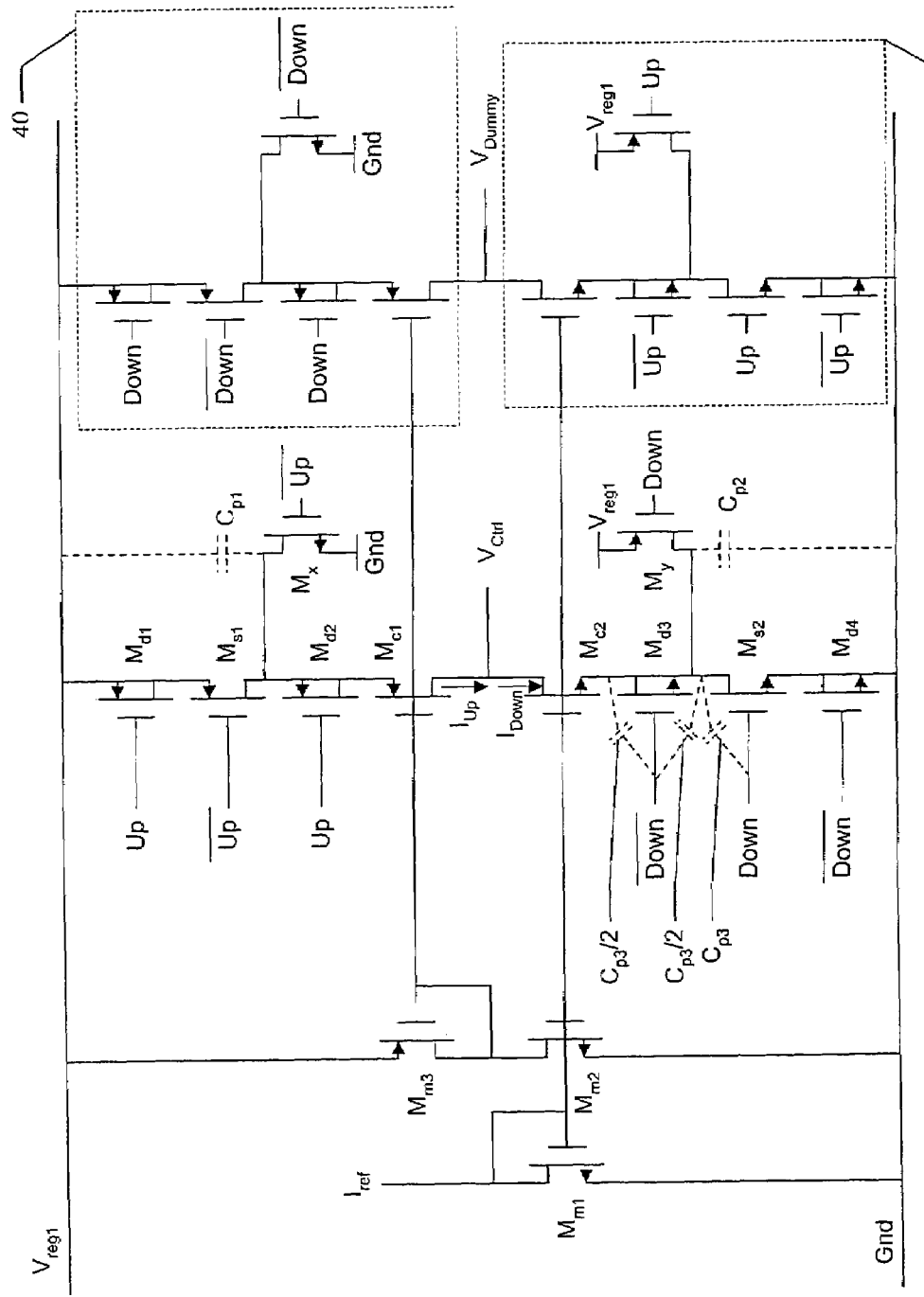
FIG. 3 is a circuit diagram of one embodiment of a charge pump shown in FIG. 1.

Turning next to FIG. 3, a circuit diagram of one embodiment of the charge pump 18 is shown. Other embodiments are possible and contemplated. In FIG. 3 and other circuit diagrams herein, PMOS transistors are illustrated with an arrow pointing into the transistor on the source terminal (e.g. transistor $M_{d1}$ is a PMOS transistor) and NMOS transistors are illustrated with an arrow pointing out of the transistor on the source terminal (e.g. transistor $M_{d4}$ is an NMOS transistor). Each of the NMOS and PMOS transistors include a gate terminal, a source terminal, and a drain terminal.

In the embodiment of FIG. 3, the charge pump 18 includes current mirroring transistors $M_{m1}$, $M_{m2}$, and $M_{m3}$ which serve to provide a current proportional to the reference current $I_{ref}$ through transistors $M_{c1}$ and $M_{c2}$ as up and down currents $I_{up}$ and $I_{down}$, respectively. The current mirror is non-cascoded. Additionally, the charge pump 18 includes a series connection of transistors $M_{d1}$, $M_{s1}$, $M_{d2}$, and $M_{c2}$ between the $V_{Ctrl}$ output node and the $V_{reg1}$ power supply. The source and drain terminals of the $M_{d1}$ and $M_{d2}$ transistors are shorted. Coupled between the drain terminal of the $M_{s1}$ transistor (and the source terminal of the $M_{c1}$ transistor) and the Ground (Gnd) is the transistor $M_x$. The gate terminals of the $M_{d1}$ and $M_{d2}$ transistors are coupled to the Up signal, and the gate terminals of the $M_{s1}$ and $M_x$ transistors are coupled to the complement of the Up signal (referred to as "Up bar" herein and shown as the word "Up" with a bar over it in FIG. 3). Shown in dotted form between the source terminal of the $M_{c1}$ transistor and the $V_{reg1}$ power supply is a parasitic capacitance $C_{p1}$. The parasitic capacitance $C_{p1}$ represents the total capacitance present at the source of transistor $M_{c1}$. The parasitic capacitance $C_{p1}$ may include the source to supply parasitic capacitance of transistors $M_{c1}$, $M_{s1}$, and $M_{d2}$, as well as the drain to supply parasitic capacitance of transistors $M_{d2}$ and $M_x$. Additionally, the capacitance may be affected by the gate to drain parasitic capacitance of $M_{s1}$ and the gate to source parasitic capacitance of $M_{c1}$. The gate terminal of the transistor $M_{c1}$ is coupled to the gate terminal of transistor $M_{m3}$.

Furthermore, the charge pump 18 includes a series connection of transistors $M_{c2}$, $M_{d3}$, $M_{s2}$, and $M_{d4}$ between the $V_{Ctrl}$ output node and Gnd. The source and drain terminals of the $M_{d3}$ and $M_{d4}$ transistors are shorted. Coupled between the drain terminal of the $M_{s2}$ transistor (and the source terminal of the $M_{c2}$ transistor) and the $V_{reg1}$ power supply is the transistor $M_y$. The gate terminals of the $M_{d3}$ and $M_{d4}$ transistors are coupled to the complement of the Down signal (referred to as "Down bar" herein and shown as the word "Down" with a bar over it in FIG. 3), and the gate terminals of the $M_{s2}$ and $M_y$ transistors are coupled to the Down signal. Shown in dotted form between the source terminal of the $M_{c2}$ transistor and Gnd is the parasitic capacitance $C_{p2}$. The parasitic capacitance $C_{p2}$ represents the total capacitance present at the source of transistor $M_{c2}$. The parasitic capacitance $C_{p1}$ may include the source to supply parasitic capacitance of transistors $Mc_2$, $M_{s2}$, and $M_{d3}$, as well as the drain to supply parasitic capacitance of transistors $M_{d3}$ and $M_y$. Additionally, the capacitance may be affected by the gate to drain parasitic capacitance of $M_{s2}$ and the gate to source parasitic capacitance of $M_{c2}$. The gate terminal of the transistor $M_{c2}$ is coupled to the gate terminal of transistor $M_{m2}$. Additionally shown in dotted form are the parasitic drain to gate capacitance of transistor $M_{s2}$ ($C_{p3}$) and the parasitic drain to gate and source to gate capacitances ($C_{p3}/2$) of transistor $M_{d3}$. It is noted that transistors $M_{s1}$ and $M_{d2}$ have similar parasitic capacitances as transistors $M_{s2}$ and $M_{d3}$, respectively, not shown in FIG. 3.

Finally, the charge pump 18 includes: (i) a set of transistors similar in connection to $M_{d1}$, $M_{s1}$, $M_{d2}$, $M_{c2}$, and $M_x$ except the gate terminals are connected to Down or Down bar (as shown in FIG. 3) and the drain terminal of the transistor similar to $M_{c2}$ is connected to a $V_{dummy}$ node (reference numeral 40); and (ii) a set of transistors similar in connection to $M_{c2}$, $M_{d3}$, $M_{s2}$, $M_{d4}$, and $M_y$ except the gate terminals are connected to Up or Up bar (as shown in FIG. 3) and the drain terminal of the transistor similar to $M_{c1}$ is connected to the $V_{dummy}$ node (reference numeral 42).

Generally, transistors $M_{c1}$ and $M_{c2}$ are the current devices in the charge pump 18, providing the $I_{up}$ and $I_{down}$ currents (respectively) to the output node $V_{Ctrl}$. The transistors $M_{s1}$ and $M_{s2}$ are the switching transistors used to switch the currents on and off responsive to the Up and Down signals, respectively. The switching of transistors frequently generates noise which may disturb the output of the charge pump 18, and thus reduce its accuracy and effectiveness. For example, when a transistor is switched from on (conducting) to off (not conducting), charge injection may occur. Generally speaking, charge injection occurs if charge in the channel of the switching transistor does not recombine in the channel when the switching transistor is switched to the off state. This charge travels out of the channel onto the source and/or drain nodes of the switching transistor, changing the voltage on these nodes. Since this voltage change is unintentional, the change represents error (noise) and may affect the output voltage $V_{Ctrl}$. Additionally, since the Up and Down signals may transition rapidly to active and inactive states, clock feedthrough (charge transmitted from the gate to the drain or source of the transistor via the parasitic capacitances between the gate and the drain or source) may occur, which also represents error.

The switching transistors $M_{s1}$ and $M_{s2}$ are placed on the source side of the current transistors $M_{c1}$ and $M_{c2}$ (i.e. the side opposite the output node $V_{Ctrl}$). Accordingly, any switching error which may occur in switching transistors $M_{s1}$ and $M_{s2}$ is attenuated through $M_{c1}$ and $M_{c2}$. As described in more detail below, the charge pump 18 includes several mechanisms for reducing switching error from transistors $M_{s1}$ and $M_{s2}$. Any switching error not removed via these mechanisms may be attenuated, further reducing its effect on the output node $V_{Ctrl}$.

The mechanisms used in the charge pump 18 for reduction of charge injection errors and clock feedthrough errors will be described next with respect to transistors $M_{s2}$, $M_{d3}$, and $M_{d4}$. Similar operation occurs with respect to transistors $M_{s1}$, $M_{d1}$, and $M_{d2}$ (although the voltages that cause switching on and off differ since transistors $M_{s1}$, $M_{d1}$, and $M_{d2}$ are PMOS transistors while transistors $M_{s2}$, $M_{d3}$, and $M_{d4}$ are NMOS transistors).

Transistors $M_{d3}$ and $M_{d4}$ have gate terminals coupled to the complement of the signal on the gate terminal of transistor $M_{s2}$. In the illustrated embodiment, for example, the Down signal is received at the gate terminal of transistor $M_{s2}$, while the Down bar signal is received at the gate of transistors $M_{d3}$ and $M_{d4}$. Accordingly, during times that transistor $M_{s2}$ is being switched on (Down transitioning to a $V_{reg1}$ voltage), transistors $M_{d3}$ and $M_{d4}$ are being switched off (Down bar transitioning to a Gnd voltage) and vice versa.

The aforementioned structure may reduce charge injection error. When $M_{s2}$ is being switched off, and injecting charge onto its drain and/or source, $M_{d3}$ and $M_{d4}$ are being switched on. Thus, the channels of $M_{d3}$ and $M_{d4}$ acquire charge during approximately the same time period that transistor $M_{s2}$ is injecting charge. The injected charge (are a large portion thereof) may be drawn into the channels of $M_{d3}$ and $M_{d4}$ as these channels acquire charge, thus reducing the amount of charge actually injected onto the drain and source nodes of transistor $M_{s2}$.

The transistors $M_{d3}$ and $M_{d4}$ may be carefully sized with respect to transistor $M_{s2}$ in order to reduce the charge injection error appropriately. If the transistors are not sized appropriately, the charge injection reduction may not be minimized or may be overcompensated (making the effective charge injection negative). The assumption may be made that approximately half of the charge injected by transistor $M_{s2}$ is injected onto the source and the remaining charge injected by transistor $M_{s2}$ onto the drain. According, transistors $M_{d3}$ and $M_{d4}$ may be sized approximately half of the size of transistor $M_{s2}$, thus being capable of drawing the ½ charge injection from the corresponding source or drain terminal of transistor $M_{s2}$. The mobility of the devices affects the amount of charge injection (since the mobility may affect the recombination of charge in the channel), and the mobility may be factored into the sizing of the transistors $M_{d3}$ and $M_{d4}$. For example, the transistors $M_{d3}$ and $M_{d4}$ may be sized plus or minus 10% of ½ the size of transistor $M_{s2}$.

It is noted that the "size" of a transistor may be the ratio of the channel width to the channel length. Thus, a first transistor may be ½ the size of a second transistor if the ratio of the channel width and channel length of the first transistor is ½ the ratio of the channel width and channel length of the second transistor. In general, the channel length of the transistors may nominally be the same for most of the transistors in FIG. 3. Particularly, it may be desirable for the channel length of transistors $M_{s1}$, $M_{s2}$, $M_{d1}$, $M_{d2}$, $M_{d3}$, and $M_{d4}$ to be nominally the same since charge injection is related to the transit time across the channel.

The structure of transistors $M_{s2}$, $M_{d3}$, and $M_{d4}$ may also reduce clock feedthrough error. Illustrated in FIG. 3 is the gate to drain parasitic capacitance of transistor $M_{s2}$ ($C_{p3}$) as well as the gate to drain and gate to source parasitic capacitance of transistor $M_{d3}$ ($C_{p3}/2$ each). The parasitic capacitances of transistor $M_{d3}$ are approximately ½ the parasitic capacitance of transistor $M_{s2}$. Additionally, since the source and drain terminals of transistor $M_{d3}$ are shorted, the parasitic capacitances are in parallel. Accordingly, the sum of the parasitic capacitances of transistor $M_{d3}$ is approximately $C_{p3}$.

Since the gate terminal of transistor $M_{d3}$ receives the complement of the signal on the gate terminal of transistor $M_{s2}$, the clock feedthrough from transistor $M_{d3}$ to the drain of transistor $M_{s2}$ (through a total parasitic capacitance of $C_{p3}$) may be approximately the same as the clock feedthrough from transistor $M_{s2}$ to the drain of transistor $M_{s2}$, but of the opposite polarity. Summing these two clock feedthrough errors may produce a total clock feedthrough error on the drain of transistor $M_{s2}$ of approximately zero, thereby reducing the clock feedthrough error. A similar discussion applies to the gate to source and drain parasitic capacitances of transistor $M_{d4}$ and the gate to source parasitic capacitance of transistor $M_{s2}$ (and to the transistors $M_{d1}$, $M_{d2}$, and $M_{s2}$).

It is desirable to match the currents $I_{up}$ and $I_{down}$, so that equal width pulses of the Up and Down signals produce equal charge transferred to or drawn from the $V_{Ctrl}$ output node (respectively). The transistors $M_{c1}$ and $M_{c2}$ may be sized similarly to nominally provide the same current. Some effects (such as channel length modulation, drain induced barrier loading (DIBL), etc.) can temporarily affect this balance and thus contribute to error on the $V_{Ctrl}$ output node. Many of these effects can be reduced by increasing the channel length of the $M_{c1}$ and $M_{c2}$ transistors (i.e. these transistors may not have the minimum channel length in a given process technology). For example, in one specific implementation, a ratio of the channel length of transistors $M_{c1}$ and $M_{c2}$ to the other transistors (which may have the minimum channel length for the process) may be in the range of approximately 3–7, and preferably about 5.6, although other ratios may be used. However, increasing the channel length (and the diffusion area width) of these devices leads to larger parasitic capacitances (e.g. the parasitic capacitance $C_{p2}$ between the source of transistor $M_{c2}$ and ground and the parasitic capacitance $C_{p1}$ between the source of transistor $M_{c1}$ and $V_{reg1}$). The parasitic capacitances $C_{p1}$ and $C_{p2}$ may act to cause additional current to flow through transistors $M_{c1}$ and $M_{c2}$, respectively, after the corresponding switch $M_{s1}$ and $M_{s2}$ has switched off the current flow. This additional current flow is a source of error in the output voltage $V_{Ctrl}$. The larger parasitic capacitances may also require larger switch transistors $M_{s1}$ and $M_{s2}$ to switch the parasitic capacitances, which may exacerbate clock feedthrough and charge injection errors.

The charge pump 18 employs an active shutoff of the current transistors $M_{c1}$ and $M_{c2}$ using transistors $M_x$ and $M_y$, respectively. The active turnoff of $M_{c2}$ by transistor $M_y$ will be described, and the active turnoff of $M_{c1}$ by transistor $M_x$ may be similar, with an appropriate change in polarities of voltages to account for the different transistor types.

Transistor $M_y$ is a PMOS transistor coupled between the $V_{reg1}$ power supply and the source of transistor $M_{c2}$. When transistor $M_{s2}$ switches off in response to the down signal switching to a ground voltage, transistor $M_y$ activates and actively charges the source of $M_{c2}$ to the $V_{reg1}$ voltage. This quick charging of the source of transistor $M_{c2}$ ensures that, regardless of the gate voltage of transistor $M_{c2}$ (which is less than or equal to $V_{reg1}$), the current flow through $M_{c2}$ stops quickly.

Another source of mismatch in the $I_{up}$ and $I_{down}$ currents for a given Up or Down signal pulse width may be the uneven loading of the Up and Down signals. By providing the sets of transistors illustrated at reference numerals 40 and 42, the load on the Up and Down signals may be balanced. For example, the Up signal is coupled to the gates of transistors $M_{d1}$, $M_{d2}$, a transistor similar to $M_{s2}$ and a transistor similar to $M_y$. The Down signal is coupled to the gates of a transistor similar to $M_{d1}$, a transistor similar to $M_{d2}$, transistor $M_{s2}$, and transistor $M_y$. Accordingly, over process variation and process mismatch, the Up and Down signals should be approximately evenly loaded (and thus edge rates on these signals may be approximately equal). Transistors are said to be similar in this context if the transistors are nominally matched in characteristics (e.g. the same diffusion area width, channel length, etc.).

As mentioned above, transistors $M_{m1}$, $M_{m2}$, and $M_{m3}$ comprise current mirroring for mirroring the reference current $I_{ref}$ to the $I_{up}$ and $I_{down}$ currents of $M_{c1}$ and $M_{c2}$. A non-cascoded current mirror is used in this embodiment, which may reduce power consumption, increase headroom, and ease the task of keeping transistors in saturation. The noise suppression may be provided via the level shifter and voltage regulator, as described above. Other embodiments may employ cascoding of the current mirrors (e.g. for use in embodiments not having the voltage regulator of FIG. 1 or having a different voltage regulator).

Figure 4:
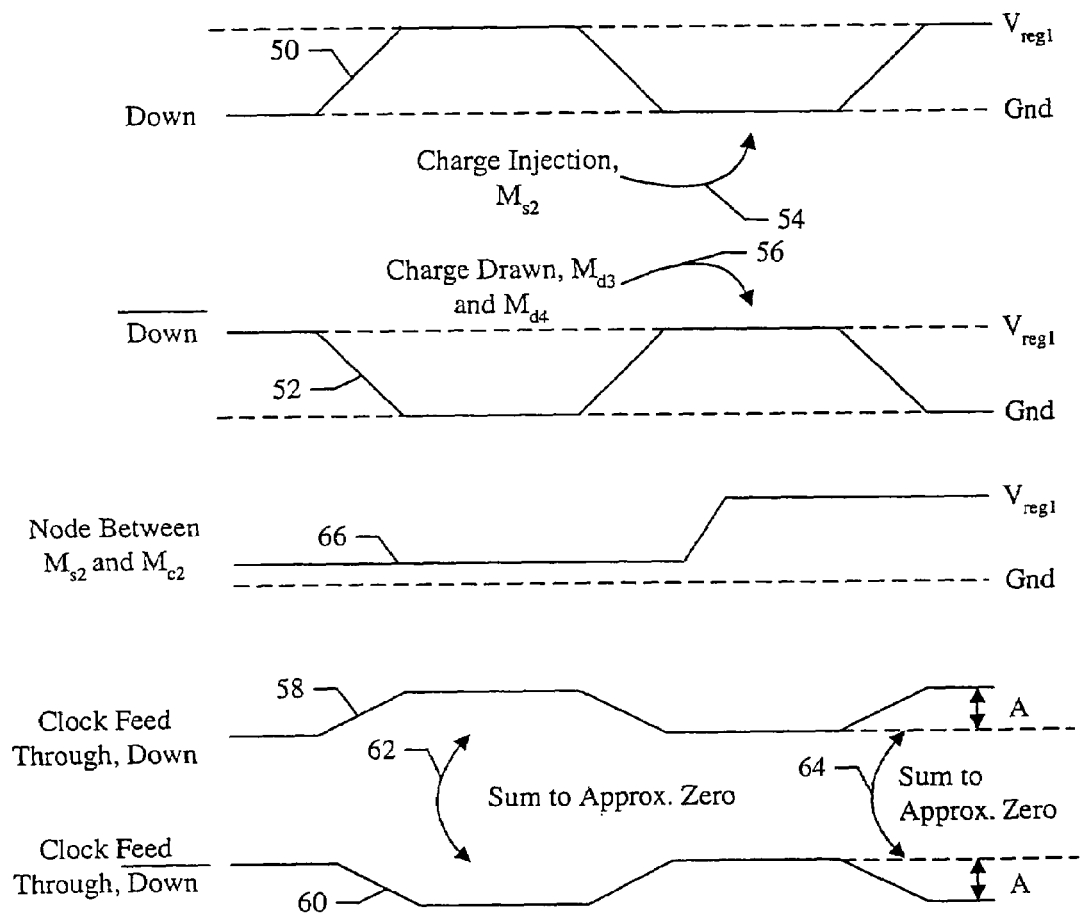
FIG. 4 is a timing diagram illustrating operation of portions of one embodiment of the charge pump shown in FIG. 2.

FIG. 4 is a timing diagram further illustrating the operation of transistors $M_{s2}$, $M_{d3}$, $M_{d4}$, and $M_y$ for an exemplary set of transitions of the Down and Down bar signals. The Down and Down bar signals are represented by waveforms 50 and 52, respectively.

When Down transitions from high to low, charge injection may occur from transistor $M_{s2}$ (arrow 54). However, at approximately the same time the down bar signal transitions from low to high, activating transistors $M_{d3}$ and $M_{d4}$. Thus, these transistors may draw charge (including the injected charge), offsetting the injected charge (arrow 56).

The clock feedthrough from Down and Down bar is also shown in FIG. 4 (wave forms 58 and 60. Each of wave forms 58 and 60 is shown having approximately the same amplitude (A), since the Down and Down bar signals have the same swing and the parasitic capacitance through which they travel is approximately the same. Since the wave forms 58 and 60 have opposite polarities, the voltages sum to approximately zero at any given point (e.g. arrows 62 and 64).

Finally, a wave form 66 is illustrated in FIG. 4 illustrating an exemplary voltage on the node between the transistor $M_{s2}$ and the transistor $M_{c2}$. The voltage may have some value between $V_{reg1}$ and ground while the transistor $M_{s2}$ is on, but than rapidly transitions to $V_{reg1}$ when the transistor $M_{s2}$ is turned off. The rapid transition occurs in response to the transistor $M_y$ actively charging the node.

Figure 5:
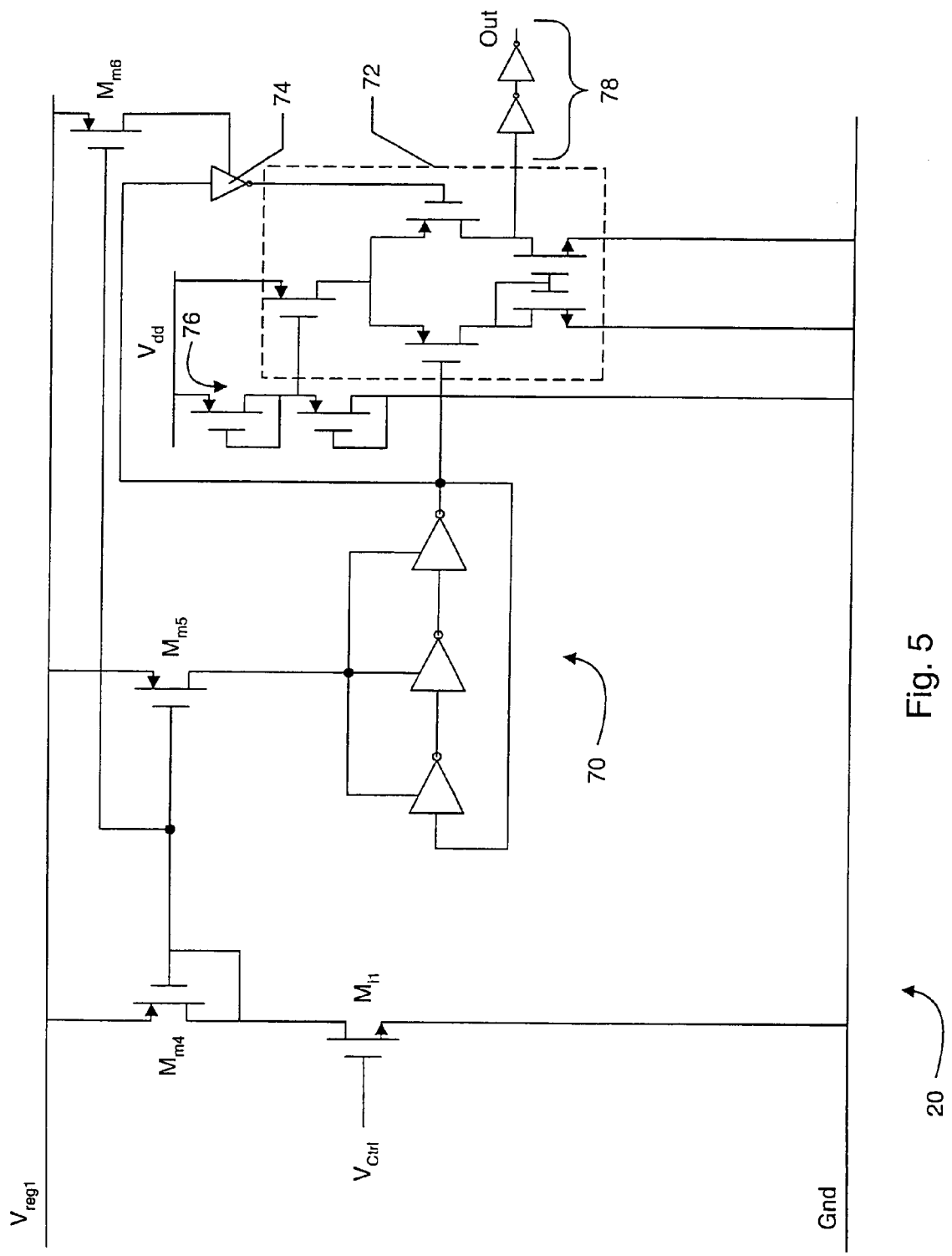
FIG. 5 is a circuit diagram of one embodiment of a voltage controlled oscillator shown in FIG. 1.

Turning next to FIG. 5, a circuit diagram of one embodiment of the VCO 20 is shown. Other embodiments are possible and contemplated. In the embodiment of FIG. 5, the VCO 20 includes an input transistor $M_{i1}$, a current mirror including transistors $M_{m4}$, $M_{m5}$, and $M_{m6}$, a ring oscillator 70, an output amplifier 72, an inverter 74, and a self-biasing circuit 76. The input transistor $M_{i1}$ has a gate terminal coupled to receive the $V_{Ctrl}$ voltage and is coupled between the current mirror and ground. The current mirror transistor $M_{m5}$ is coupled to the $V_{reg1}$ power supply and to the power supply terminal for the inverters in the ring oscillator 70. The current mirror transistor $M_{m6}$ is coupled between the $V_{reg1}$ voltage and to the power supply terminal of the inverter 74. A first input to the amplifier 72 is coupled to the output of the ring oscillator 70. The output of the ring oscillator 70 is also coupled to the input of the inverter 74, which is coupled to the second input of the amplifier 72. The self-biasing circuit 76 provides a bias voltage to the amplifier 76, generated from the $V_{dd}$ power supply. The output of the amplifier 72 is coupled to a pair of series-coupled inverters 78.

Generally, the input transistor $M_{i1}$ develops a current in response to the $V_{Ctrl}$ voltage input to the gate terminal. The current mirror transistor $M_{m4}$ mirrors the current to the current mirror transistors $M_{m5}$ and $M_{m6}$. The transistor $M_{m5}$ provides charge to the power supply terminals of the inverters in the ring oscillator 70. Thus, as the current in the transistor $M_{m5}$ increases (reflecting an increase in the control voltage $V_{Ctrl}$), the power supply to the ring oscillator 70 increases and thus the oscillation frequency of the VCO 20 increases. Similarly, as the current in the transistor $M_{m5}$ decreases, the oscillation frequency of the VCO 20 decreases. However, the signal swing of the ring oscillator 70 varies with the supply voltage as well, and may be small.

The output amplifier 72 is a differential amplifier providing an amplified, non-differential output to the output buffers 78. The output buffers 78 complete the transition of the output signal to a full $V_{dd}$ swing. Since the output swing of the ring oscillator 70 is between ground and a voltage which may be small (the power supply voltage provided by the transistor $M_{m5}$), the amplifier employs PMOS input transistors (which react to low voltages well). The amplifier requires a differential input, however, and the combination of the inverter 74 supplied with a power supply through transistor $M_{m6}$ in combination with the output of the ring oscillator 70 may closely approximate a differential input. If an inverter powered by the $V_{reg1}$ power supply were used to provide the second input, the swing of the output signal of that inverter would not match the output of the ring oscillator 70. On the other hand, the power supply voltage for the inverter 74 may be close to the power supply voltage of the ring oscillator 70. Accordingly, although the output of the inverter 74 is slightly delayed with respect to the output of the ring oscillator 70, the output of the inverter 74 may more closely be a complement of output of the ring oscillator 70. Accordingly, the common mode noise rejection of the VCO 20 may be improved using the structure shown in FIG. 5.

It is noted that, in one implementation, the size of transistor $M_{m6}$ may be approximately ⅓ the size of the transistor $M_{m5}$ to provide approximately the same power supply voltage for the inverter 74 and the ring oscillator 70. Other embodiments may change to size ratio to match the number of inverters in the ring oscillator 70. For example, if an embodiment of the ring oscillator 70 includes 5 inverters, the transistor $M_{m6}$ may be approximately ⅕ the size of the transistor $M_{m5}$;

The self-biasing circuit 76 operates to provide a bias voltage for amplifier 72 which is a relatively constant ratio of $V_{dd}$ over the range of values that $V_{dd}$ may take on (especially due to switching noise, etc.) and over the range of process variation, operating temperature, etc. The ratio of the bias voltage to $V_{dd}$ is set by the ratio of the sizes of each transistor in self-biasing circuit 76. The self-biasing may help ensure a gain in the amplifier 72 over the range of $V_{dd}$ values which may be experienced during operation.

Additionally, the VCO 20 includes a non-cascoded current mirror including transistors $M_{m4}$, $M_{m5}$, and $M_{m6}$. Use of the non-cascoded current mirror (similar to the charge pump 18) allows for power consumption reduction and saturation of devices, as mentioned before. Furthermore, the non-cascoded current mirror results in a lower voltage drop between $V_{reg1}$ and the power supply to the ring oscillator 70, allowing a wider range of operation for the ring oscillator 70 than in cascoded current mirroring were used.

It is noted that, while the ring oscillator 70 illustrated in FIG. 5 is shown as three series coupled inverters (with the output of the last inverter connected to the input of the first inverter), any odd number of inverters may be used. Furthermore, if fully differential oscillator stages are used, an even number of stages may be used. As used herein, the term "power supply terminal" refers to a terminal of a circuit designed to be connected to a power supply. In the ring oscillator 70 and inverter 74, the power supply terminal is coupled to another device to allow the voltage supplied, during use, to be varied.

Turning next to FIG. 6, a circuit diagram of one embodiment of the voltage regulator 12 is shown. Other embodiments are possible and contemplated. In the embodiment of FIG. 6, the voltage regulator 12 includes transistors $M_{sf1}$, $M_{sf2}$, and $M_{sf3}$ coupled in a source follower configuration. Each of the transistors $M_{sf1}$, $M_{sf2}$, and $M_{sf3}$ have a gate terminal coupled to a node between a resistor coupled to the $V_1$ power supply and capacitor coupled to ground (e.g. the gate terminal of the transistor $M_{sf1}$ is coupled to the node between the resistor $R_3$ and the capacitor $C_4$). A bandgap generator 80 is used to generate a reference voltage, and an output transistor 82 is coupled to receive the reference voltage and provide it to an operational amplifier (op-amp) 84. The output transistor 82 is coupled to the transistor $M_{sf3}$ as well, and a decoupling capacitor $C_{Dec}$ is coupled between transistor 82 and ground. The op-amp 84 amplifies the reference voltage from the bandgap generator 80 to produce the first regulated voltage $V_{reg1}$ to be output by the voltage regulator 12. The output of the op-amp 84 passes through the common source transistor $C_{cs1}$ to the output $V_{reg1}$ and to an input of a second op-amp 86. The output voltage $V_{reg1}$ is passed though a feedback network to the second input of the op-amp 84, where the ratio of the resistors in the feedback network, in conjunction with the gain of op-amp 84, divides the desired output voltage $V_{reg1}$ back down to the reference voltage output from the bandgap generator 80. For example, the reference voltage may be 1.2 volts and the output voltage $V_{reg1}$ may be 2.0 volts. Additionally, a transistor $M_{x1}$ is coupled between the $V_{reg1}$ output node and ground, and has its gate terminal coupled to the output node of the op-amp 84 (the gate terminal of the transistor $M_{cs1}$). A capacitor $C_{f1}$ is coupled between the $V_{reg1}$ output node and the output of the op-amp 84. Finally, a decoupling capacitor $C_{Dec}$ is coupled between the $V_{reg1}$ output node and ground. The second op-amp 86 is connected in a unity gain configuration (the feedback network is a wire) and employs an output transistor $M_{cs2}$ coupled between the transistor $M_{sf2}$ and the $V_{reg2}$ output node of the voltage regulator 12. Alternatively, the second op-amp 86 may be coupled in the same fashion as op-amp 84 and in parallel with op-amp 84 to produce the $V_{reg2}$ voltage on the $V_{reg2}$ output node. Similar to the $V_{reg1}$ output node, a decoupling capacitor $C_{Dec}$ is coupled between the $V_{reg2}$ output node and ground, a transistor $M_{x2}$ is coupled between the $V_{reg2}$ output node and ground with a gate terminal coupled to the output of the op-amp 86, and a capacitor $C_{f2}$ is coupled between the $V_{reg2}$ output node and the output of the op-amp 86. The gate terminals of transistors $M_{sf1}$ and $M_{sf2}$ are further coupled to a power-up control circuit 88.

The source follower transistors $M_{sf1}$, $M_{sf2}$, and $M_{sf3}$ are used to provide current to the output transistors $M_{cs1}$, $M_{cs2}$, and 82, respectively. Generally, the source follower connection provides a low output impedance (the output being the terminal of the transistor $M_{sf1}$, $M_{sf2}$ and $M_{sf3}$ coupled to the output transistor $M_{cs1}$, $M_{cs2}$, and 82, respectively), and thus the source follower connection may be an good voltage source. The transistors $M_{sf1}$, $M_{sf2}$ and $M_{sf3}$ may be sensitive to noise on the $V_1$ power supply, particularly noise transmitted to the gate terminals of these transistors. The resistor/capacitor series connection with the gate terminal of these transistors coupled to the node connecting the resistor and the capacitor forms a low pass filter which may limit the amount of noise from the $V_1$ power supply which is transmitted to the gate terminal of the corresponding transistor. The low pass filter effectively decouples the gate terminal from the $V_1$ power supply and couples the gate terminal to ground through the capacitor within the low pass filter. In one implementation, for example, using a resistance of 5 Mega-ohms and a capacitance of 100 picoFarads, at least 15 dB of noise rejection may be experienced. In this manner, the transistors $M_{sf1}$, $M_{sf2}$, and $M_{sf3}$ may act as better current sources even in the presence of noise. However, other embodiments of the voltage regulator 12 may not employ the resistor/capacitor connections to the gate of the source follower transistors, as desired, opting for a more conventional source follower connection or diode configuration.

While a low pass filter is used in the illustrated embodiment, any filter could be used depending on the frequencies of noise desired to be filtered. Furthermore, a combination of filters may be used.

Having the source follower transistors $M_{sf1}$, $M_{sf2}$, and $M_{sf3}$ in series with another device may also limit the amount of voltage available below the series connection. Connecting a source follower to the $V_1$ power supply may induce body effect in the source follower transistors, which increases the threshold voltage of the transistors and thus the voltage drop across the transistors. If the voltage drop across the source follower transistors increases, there is less remaining voltage (between the voltage at the output of the source follower and ground) available for use in the remaining circuits (and, in the case of the transistors $M_{sf1}$ and $M_{sf2}$, less voltage available for output as $V_{reg1}$ and $V_{reg2}$). In one example, $V_1$ is 3.3 volts and $V_{reg1}/V_{reg2}$ is 2.0 volts, leaving only 1.3 volts for drops across $M_{sf1}$ and $M_{sf2}$ and the corresponding series devices $M_{cs1}$ and $M_{cs2}$.

Figure 7:
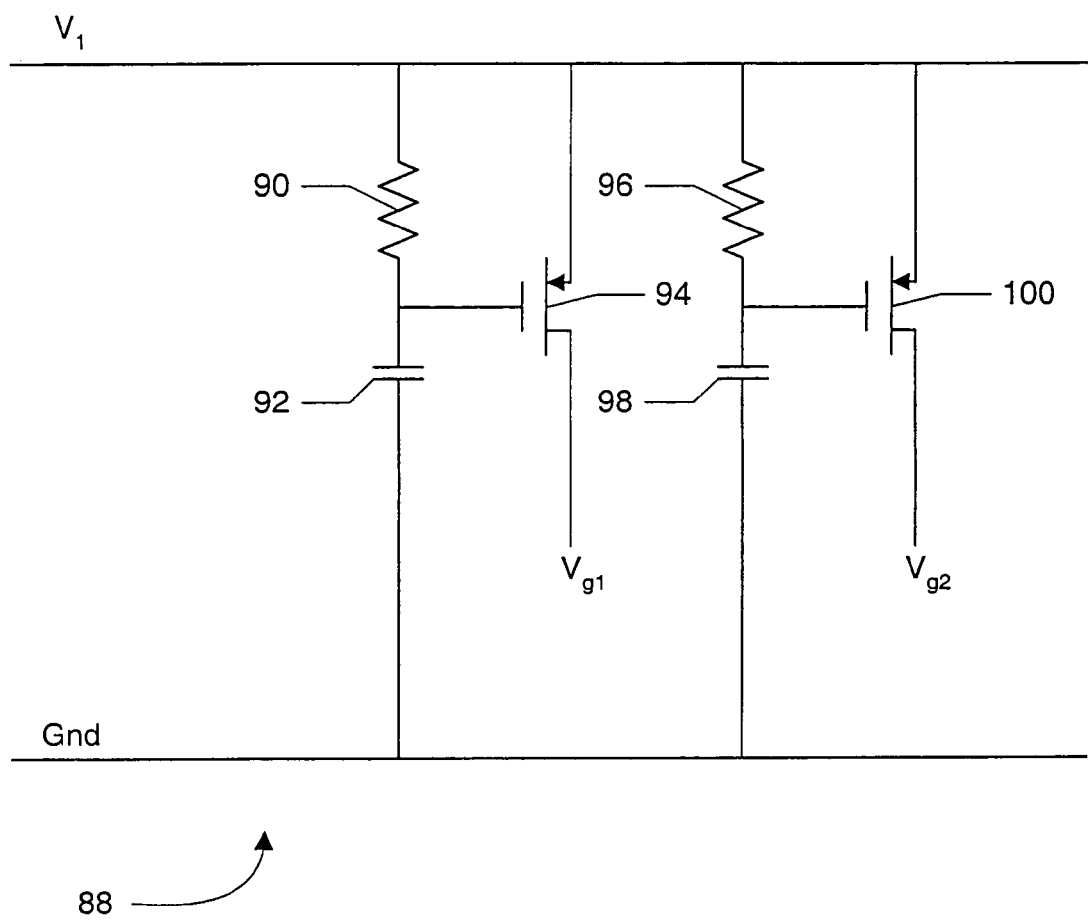
FIG. 7 is a circuit diagram of one embodiment of a power-up control circuit shown in FIG. 6.

The body effect in the transistors $M_{sf1}$ and $M_{sf2}$ may be offset (at least partially), by using transistors with lower threshold voltages for transistors $M_{sf1}$ and $M_{sf2}$. However, such transistors may also limit the voltages which may be tolerated between any two terminals. For example, in one implementation, the lower threshold transistors may be limited to 1.5 volts across any two terminals. During operation, the lower amount of voltage may not present a problem since most of the voltage between $V_1$ and ground is used for $V_{reg1}/V_{reg2}$ (e.g. in the above example, 1.3 volts separate $V_1$ and $V_{reg1}/V_{reg2}$). During power up of the voltage regulator circuit 12, these transistors may be protected from overvoltage conditions using power-up control circuit 88. Particularly, the gate terminals of the transistors $M_{sf1}$ and $M_{sf2}$, during power up, may initially be zero volts (in the absence of power-up control circuit 88). As the power supply $V_1$ is powered to its operating level, the gate terminals of transistors $M_{sf1}$ and $M_{sf2}$ charge more slowly to the $V_1$ voltage level (at a rate determined by the RC time constant of the resistor and capacitor coupled to the gate terminals). Thus, during power up, the full $V_1$ voltage (or substantially the voltage, as the RC network charges) may be present between the gate and drain terminals of $M_{sf1}$ and $M_{sf2}$. Power-up control circuit 88 provides a voltage ($V_{g1}$ and $V_{g2}$ in FIG. 6) during power up to ensure that the over-voltage condition does not occur, protecting the $M_{sf1}$ and $M_{sf2}$ transistors. For example, in one embodiment, the power-up control circuit 88 may provide a $V_1$ voltage level at $V_{g1}$ and $V_{g2}$. An example of the power-up control circuit 88 is shown in FIG. 7 below. For embodiments in which the transistors $M_{sf1}$ and $M_{sf2}$ are not implemented with lower threshold voltages and/or voltage tolerances, the power-up control circuit 88 may be omitted.

As used herein, the term "power up" refers to the application of a power supply voltage or voltages to a circuit after a period of time in which the circuit has been unpowered by the voltages.

The transistors $M_{x1}$ and $M_{x2}$ are provided to maintain a relatively constant current load at the $V_{reg1}$ and $V_{reg2}$ output nodes, respectively (in other words, relatively constant current through transistors $M_{cs1}$ and $M_{cs2}$, respectively) even though the current demands of the PLL 10 generally vary during operation. By keeping the current through $M_{cs1}$ and $M_{cs2}$ relatively stable, the regulation of the $V_{reg1}$ and $V_{reg2}$ voltages may be improved as well as stability, phase margin, and frequency response. It may generally be easier to regulate a voltage for a relatively constant current load, or a current load that varies within a small range. In the context of the PLL 10, stabilizing the current load may have the most effect for output frequencies of the PLL 10 at the lower end of the operating range of PLL 10.

The operation of $M_{x1}$ will be described, and the operation of $M_{x2}$ may be similar in the context of $V_{reg2}$ and $M_{cs2}$. If the current flowing out of the voltage regulator 12 through the $V_{reg1}$ terminal decreases, the voltage $V_{reg1}$ tends to rise (since the current though $M_{cs2}$ changes in proportion to its gate voltage, which hasn't yet changed). The increased voltage at $V_{reg1}$ leads to an increased voltage at the positive input of the op-amp 84, which leads to an increase in the output voltage of the op-amp 84. The gate terminal of $M_{x1}$ is coupled to the output of the op-amp 84, and is an NMOS transistor. Thus, as the output voltage of the op-amp 84 rises, the current in transistor $M_{x1}$ increases. Accordingly, the current though transistor $M_{x1}$ increases as the current traveling out of the $V_{reg1}$ output node (to the PLL 10) decreases. Similarly, as the current traveling out of the $V_{reg1}$ output node increases, the current through transistor $M_{x1}$ decreases.

Viewed in another way, transistor $M_{x1}$ is a current source which provides current inversely proportional to the current exiting the voltage regulator 12 through the $V_{reg1}$ output node. Any current source providing such a current may be used, in other embodiments. Furthermore, other embodiments of the voltage regulator 12 may not employ the current sources such as the transistors $M_{x1}$ and $M_{x2}$, as desired.

It is noted that, while the common source connection of the output transistors $M_{cs1}$ and $M_{cs2}$ may exhibit a smaller voltage drop from the source of the transistors $M_{sf1}$ and $M_{sf2}$ to the output nodes $V_{reg1}$ and $V_{reg2}$ than a source follower connection, the output impedance may be higher. Decoupling capacitances $C_{Dec}$ are included on each node, mitigating the effect of the higher output impedance. Each capacitance $C_{Dec}$ may be of any suitable size, but one embodiment may employ approximately 0.6 nanoFarads (nF) of decoupling capacitance.

It is noted that the stability of the op-amp/common source output transistor circuit may be affected by the existence of a dominant pole in the frequency response at both the output node of the op-amp and the output of the common source stage. Compensation capacitors $C_{f1}$ and $C_{f2}$ may be used to improve the stability be separating the poles. A resistor may also be placed in series with each of the capacitors $C_{f1}$ and $C_{f2}$ to remove a right half-plane zero in the response.

It is further noted that the use of a low pass filter on the gate terminal of a source follower circuit for noise reduction may be used in other contexts than a voltage regulator. The circuit may be used in any circuitry in which noise rejection is desirable. Similarly, the power-up control circuit 88 may be used to establish a voltage on any node during power up in order to protect a circuit from damage.

It is still further noted that other embodiments of the voltage regulator 12 may employ any combination of the above highlighted features, as desired.

Turning next to FIG. 7, a block diagram of one embodiment of the power-up control circuit 88 is shown. Other embodiments are possible and contemplated. In the embodiment of FIG. 7, the power-up control circuit 88 includes a resistor 90 coupled in series with a capacitor 92 between the $V_1$ power supply and ground. The resistor may be implemented with transistors, in one embodiment, or with P+ poly, as desired. The gate terminal of a transistor 94 is coupled to the node between the resistor and the capacitor, and has a source coupled to the $V_1$ power supply and a drain coupled to the $V_{g1}$ output. A similar circuit including a resistor 96, a capacitor 98 and a transistor 100 is also included, with the transistor 100 having a drain coupled to the $V_{g2}$ output.

The circuit including the resistor 90, the capacitor 92, and transistor 94 will be described. The circuit including the resistor 96, the capacitor 98, and the transistor 100 operates similarly. During power up, the voltage on the $V_1$ power supply rapidly charges to the $V_1$ voltage. However, the gate terminal of the transistor 94 charges from ground at a rate determined by the time constant of the resistor 90 and the capacitor 92. Accordingly, the transistor 94 is turned on and charges the $V_{g1}$ output node to $V_1$ rapidly. In this manner, the gate terminal of the transistor $M_{sf1}$ is held at $V_1$ during power up, reducing the gate to drain voltage on the transistor $M_{sf1}$ to a tolerable level. As the gate terminal of the transistor 94 charges to $V_1$, the transistor 94 turns off and thus the node $V_{g1}$ is not actively charged by the power-up control circuit 88 during normal operation. Thus, the power-up control circuit 88 is active during a time period commencing at power up and ending at a later time determined by the time constant of resistor 90 and capacitor 92. The time period ends when the difference between the voltage of the gate terminal of the transistor 94 and the $V_1$ voltage is less than a threshold voltage of the transistor 94.

While the embodiment of FIG. 7 includes two circuits producing two output voltages, other embodiments may include more circuits. Furthermore, an embodiment in which one circuit is used to supply gate voltages to both $M_{sf1}$ and $M_{sf2}$ from a single output node is contemplated.

Figure 8:
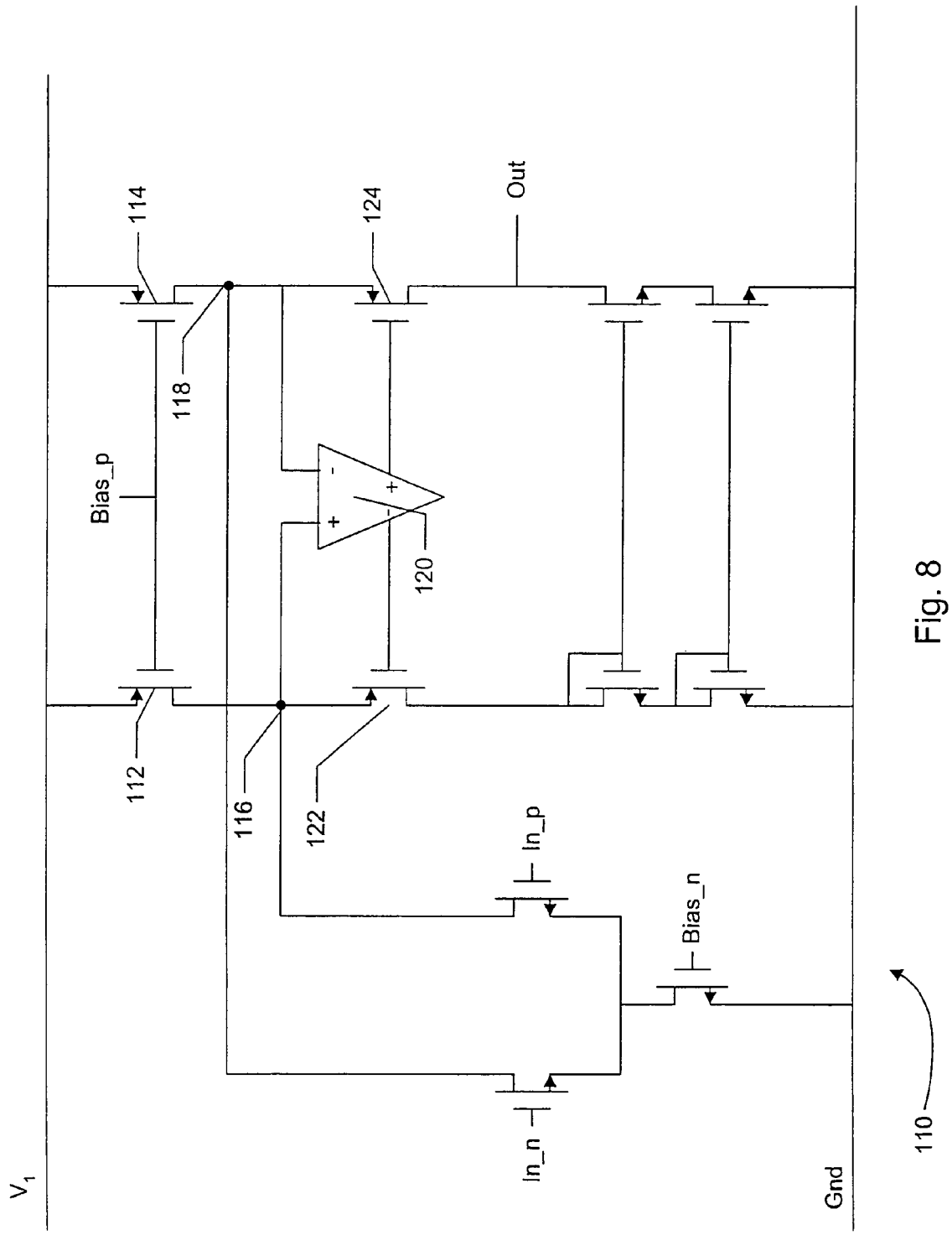
FIG. 8 is a circuit diagram of a gain boosted operation amplifier circuit.

Turning now to FIG. 8, a block diagram of a gain boosted op-amp 110 is shown. Other embodiments are possible and contemplated. The gain boosted op-amp 110 may be used as the op-amp 84 and/or 86 in FIG. 6, as desired. Furthermore, gain boosting may not be implemented in other embodiments.

Generally, the transistors 112 and 114 are intended as constant current devices. However, if the voltage at nodes 116 and 118 changes during operation (due to the positive and negative differential input voltages In_p and In_n changing), then the current in the transistors 112 and 114 may change. The voltage at nodes 116 and 118 is fed back through circuit 120 to the gate terminals of transistors 122 and 124, respectively. The current through the transistors 122 and 124 may thereby be altered to keep the current through the transistors 112 and 114 approximately constant. The gain boosting may ensure some gain from op-amp 110 over a large range of input voltage, power supply voltage, process, temperature, etc.

Figure 9:
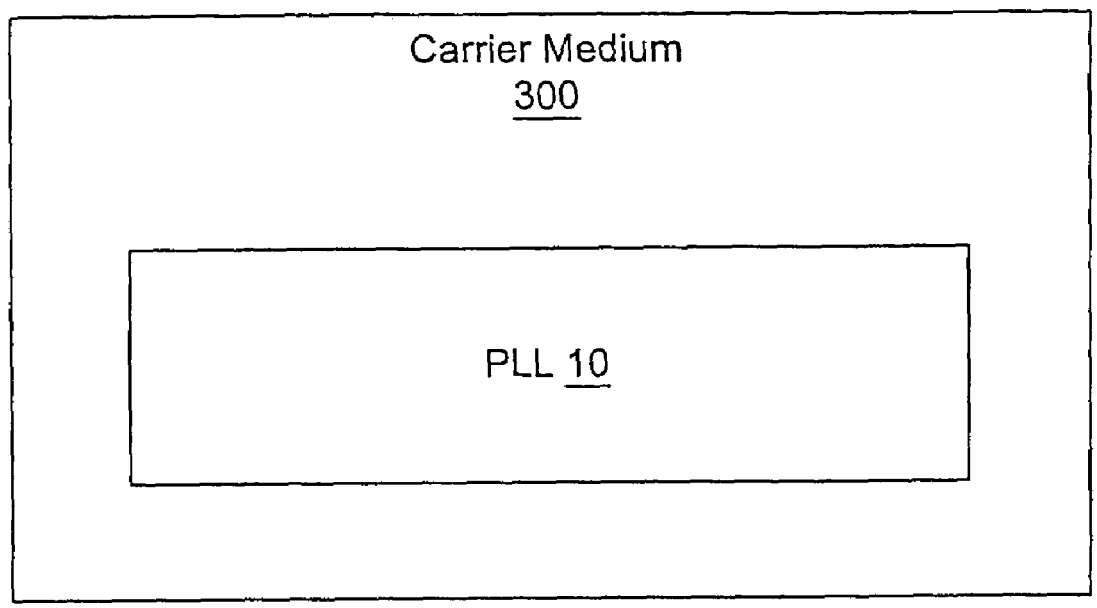
FIG. 9 is a block diagram of a carrier medium.

Turning next to FIG. 9, a block diagram of a carrier medium 300 including a database representative of PLL 10 is shown. Generally speaking, a carrier medium may include storage media such as magnetic or optical media, e.g., disk or CD-ROM, volatile or non-volatile memory media such as RAM (e.g. SDRAM, RDRAM, SRAM, etc.), ROM, etc., as well as transmission media or signals such as electrical, electromagnetic, or digital signals, conveyed via a communication medium such as a network and/or a wireless link.

Generally, the database of PLL 10 carried on carrier medium 300 may be a database which can be read by a program and used, directly or indirectly, to fabricate the hardware comprising PLL 10. For example, the database may be a behavioral-level description or register-transfer level (RTL) description of the hardware functionality in a high level design language (HDL) such as Verilog or VHDL. The description may be read by a synthesis tool which may synthesize the description to produce a netlist comprising a list of gates from a synthesis library. The netlist comprises a set of gates which also represent the functionality of the hardware comprising PLL 10. The netlist may then be placed and routed to produce a data set describing geometric shapes to be applied to masks. The masks may then be used in various semiconductor fabrication steps to produce a semiconductor circuit or circuits corresponding to PLL 10. Alternatively, the database on carrier medium 300 may be the netlist (with or without the synthesis library) or the data set, as desired.

While carrier medium 300 carries a representation of PLL 10, other embodiments may carry a representation of any portion of PLL 10, as desired, including any combination of a voltage regulator 12, a charge pump 18, a VCO 20, a loop filter 28, a configuration register 32, a level shifter 16, a PFD 14, a current generator 30, and divide circuits 22, 24, and 26, etc. or portions thereof.

Numerous variations and modifications will become apparent to those skilled in the art once the above disclosure is fully appreciated. It is intended that the following claims be interpreted to embrace all such variations and modifications.

What is claimed is:

1. A circuit comprising:
  an operational amplifier;
  a source follower transistor coupled to a power supply to provide a voltage at its source terminal, in which the source terminal has a low output impedance, the source follower transistor also having filtering to reduce noise from the power supply;
  a first transistor having a gate terminal coupled to an output of the operational amplifier and also having a first terminal coupled to the source terminal of the source follower transistor and a second terminal coupled to an output node to provide an output voltage to which a load is to be coupled, in which the load is operable to draw a first current from the output node during operation; and
  a second transistor coupled to the first transistor to draw a second current from the output node which is inversely proportional to the first current drawn by the load during operation to maintain a substantially constant current through the first transistor to regulate the output voltage, wherein a gate terminal of the second transistor is coupled to the output of the operational amplifier and wherein the second transistor has a third terminal coupled to the output node and a fourth terminal coupled to a supply return.

2. The circuit as recited in claim 1 wherein the second transistor is an N-type transistor.

3. The circuit as recited in claim 1 wherein the output node is coupled to an input terminal of the operational amplifier through a feedback network.

* * * * *